US009952275B2

(12) United States Patent
Chen et al.

(10) Patent No.: US 9,952,275 B2
(45) Date of Patent: Apr. 24, 2018

(54) METHOD AND DEVICE OF REMAINING LIFE PREDICTION FOR ELECTROMIGRATION FAILURE

(71) Applicant: Fifth Electronics Research Institute of Ministry of Industry and Information Technology, Guangdong (CN)

(72) Inventors: Yiqiang Chen, Guangdong (CN); Yunfei En, Guangdong (CN); Xiaowen Zhang, Gunagdong (CN); Yun Huang, Guangdong (CN); Yudong Lu, Guangdong (CN)

(73) Assignee: Fifth Electronics Research Institute of Ministry of Industry and Information Technology, Tianhe District, Guangzhou, Guangdong (CN)

( * ) Notice: Subject to any disclaimer, the term of this patent is extended or adjusted under 35 U.S.C. 154(b) by 627 days.

(21) Appl. No.: 14/348,844

(22) PCT Filed: Jun. 8, 2013

(86) PCT No.: PCT/CN2013/076987
§ 371 (c)(1),
(2) Date: Mar. 31, 2014

(87) PCT Pub. No.: WO2014/067287
PCT Pub. Date: May 8, 2014

(65) Prior Publication Data
US 2015/0051851 A1  Feb. 19, 2015

(30) Foreign Application Priority Data
Oct. 30, 2012  (CN) .......................... 2012 1 0424774

(51) Int. Cl.
*G01R 31/00* (2006.01)
*G01R 31/26* (2014.01)
*G01R 31/28* (2006.01)

(52) U.S. Cl.
CPC ..... *G01R 31/2642* (2013.01); *G01R 31/2601* (2013.01); *G01R 31/2858* (2013.01); *G01R 31/2639* (2013.01)

(58) Field of Classification Search
CPC ............ G01R 31/2642; G01R 31/2601; G01R 31/2858; G01R 31/2639
(Continued)

(56) References Cited

U.S. PATENT DOCUMENTS 6,350,626 B1  2/2002  Cheng et al.
2006/0125494 A1* 6/2006  Von Hagen ........ G01R 31/2648
324/722
(Continued)

FOREIGN PATENT DOCUMENTS

CN  1568430 A  1/2005
CN  1988124 A  6/2007
(Continued)

OTHER PUBLICATIONS

Search Report for related Chinese Application No. 201210424774. 8; report dated Jan. 5, 2015.
(Continued)

*Primary Examiner* — Stephanie Bloss
(74) *Attorney, Agent, or Firm* — Miller, Matthias & Hull LLP

(57) ABSTRACT

A method for predicting remaining life of electromigration failure is disclosed. The methods includes: establishing an electromigration life model of a MOS device; acquiring a normal electromigration failure lifetime τ1, based on a current density and a first environment temperature under a preset normal operating condition and the electromigration life model; acquiring a current density stress, based on a target prognostic point τ2, a second environment temperature and the electromigration life model; inputting the current density stress into a MOS device electromigration failure warning circuit based on a prognostic cell; and if the prognostic circuit of EM failure for a MOS device outputs a high level after a time τ3, acquiring a remaining life of electromigration failure corresponding to τ2' based on τ1, τ2 and τ3. A device for remaining life prediction for electromigration failure is also disclosed.

3 Claims, 3 Drawing Sheets

(58) Field of Classification Search
USPC .......................................................... 702/58
See application file for complete search history.

(56) References Cited

U.S. PATENT DOCUMENTS

| | | | |
|---|---|---|---|
| 2008/0098270 A1 | 4/2008 | De Ceuninck | |
| 2010/0127719 A1 | 5/2010 | Federspiel | |
| 2011/0285401 A1* | 11/2011 | Arnaud | G01R 31/2858 |
| | | | 324/538 |
| 2014/0109030 A1* | 4/2014 | Lee | G06F 17/5036 |
| | | | 716/115 |

FOREIGN PATENT DOCUMENTS

| | | |
|---|---|---|
| CN | 101923124 A | 12/2010 |
| CN | 102590629 A | 7/2012 |
| CN | 102955121 A | 3/2013 |

OTHER PUBLICATIONS

International Search Report for related International Application No. PCT/CN2013/076987; report dated Oct. 30, 2012.

* cited by examiner

METHOD AND DEVICE OF REMAINING LIFE PREDICTION FOR ELECTROMIGRATION FAILURE

CROSS-REFERENCE TO RELATED APPLICATIONS

This application is a 35 USC § 371 U.S. national stage filing of International Patent Application No. PCT/CN2013/076987 filed on Jun. 8, 2013, and claiming priority under the Paris Convention to Chinese Patent Application No. CN 201210424774.8 filed on Oct. 30, 2012.

TECHNICAL FIELD

The present disclosure relates to the field of life prediction for MOS device, and more particularly, to a method and device for remaining life prediction for electromigration (EM) failure.

BACKGROUND

With the rapid development of modern electronic technology, the feature sizes of Metal Oxide Semiconductor (MOS) devices decrease to nanometer, and the area percent of metal interconnects becomes larger and larger in the whole IC chip. The problem of EM failure in metal interconnect has become bottleneck for the development of large-scale integrated circuit (IC). The EM is the transport of material caused by the movement of electrons acting on metal atoms in the metal interconnect, which is shown as cavity or hillock, which causes resistance value increase linearly resulting in failure, and which seriously influences the life of IC. The factors that affect EM in metal interconnect are very complicated, including work current crowding, joule heat, temperature gradient, crystal structure, crystal orientation, interface microstructure, stress gradient, alloy composition, size and shape of interconnect, etc. Especially, under the action of higher current densities, metal atoms in the metal interconnect are more likely to cause EM along the direction of electron motion.

At present, there mainly exist two approaches to achieve the prediction and protection for reliability of MOS device: one is carrying out reliability life test for MOS device and predicting the reliability life of the device, and the other is performing failure analysis for a MOS device, determining its failure mode and failure mechanism, and proposing improvement measures based on this.

However, for the first of the above approaches, the reliability life of a MOS device is calculated by the reliability life test data based on simple stress condition, and actual working state and working environment are not involved in the reliability life test, while in practical use, the MOS device is in a complicated working environment under the comprehensive effects of various stress, so a traditional life prediction is quite different to reality, with poor reliability. In addition, such reliability prediction for MOS device costs a lot of money and time and needs to be tested regularly.

For the second of the above approaches, failure analysis of a failure device is a post diagnosis technology, which is not a best approach from both economy and technology standpoints for a device with very clear failure mode and failure mechanism.

SUMMARY

In view of the above, the object of the present disclosure is to provide a method and device for remaining life prediction for EM failure, which can improves the reliability of predicting the remaining life of a MOS device from EM failure, improves predictive efficiency and reduces cost.

According to one aspect of the disclosure, a method for predicting remaining life of EM failure includes the following steps:

establishing an EM life model of a MOS device;

acquiring a normal EM failure lifetime $\tau 1$, based on a current density and a first environment temperature under a preset normal operating condition and the EM life model;

acquiring a current density stress, based on a target prognostic point $\tau 2$, a second environment temperature and the EM life model;

inputting the current density stress into a prognostic circuit of EM failure for a MOS device; and if the prognostic circuit of EM failure for a MOS device outputs a high level after a time $\tau 3$, acquiring a remaining life of EM failure corresponding to $\tau 2'$ based on $\tau 1$, $\tau 2$ and $\tau 3$.

According to an additional aspect of the disclosure, a device for remaining lifetime prediction for EM failure includes:

a model establishing unit, configured to establish an EM life model of a MOS device;

a first acquisition unit, configured to acquire a normal EM failure lifetime $\tau 1$, based on a current density and a first environment temperature under a preset normal operating condition and the EM life model;

a second acquisition unit, configured to acquire a current density stress, based on a target prognostic point $\tau 2$, a second environment temperature and the EM life model;

a current input unit, configured to input the current density stress into a prognostic circuit of EM failure for a MOS device; and a third acquisition unit, configured to if the prognostic circuit of EM failure for a MOS device outputs a high level after a time $\tau 3$, acquire a remaining life of EM failure corresponding to $\tau 2'$ based on $\tau 1$, $\tau 2$ and $\tau 3$.

The present disclosure starts with the current active state of the MOS device to predicate the EM failure in the MOS device that may appear in the future combined with the actual working state and working environment of the device, especially before the failure, evaluates the remaining life of the device in order to replace the MOS device near failure before the occurrence of fault, to ensure reliability. The present disclosure needs no periodic test to learn the remaining life before EM failure, which can reduce the cost caused by periodic tests and improve testing efficiency.

DETAILED DESCRIPTION OF THE PREFERRED EMBODIMENTS

Figure 1:
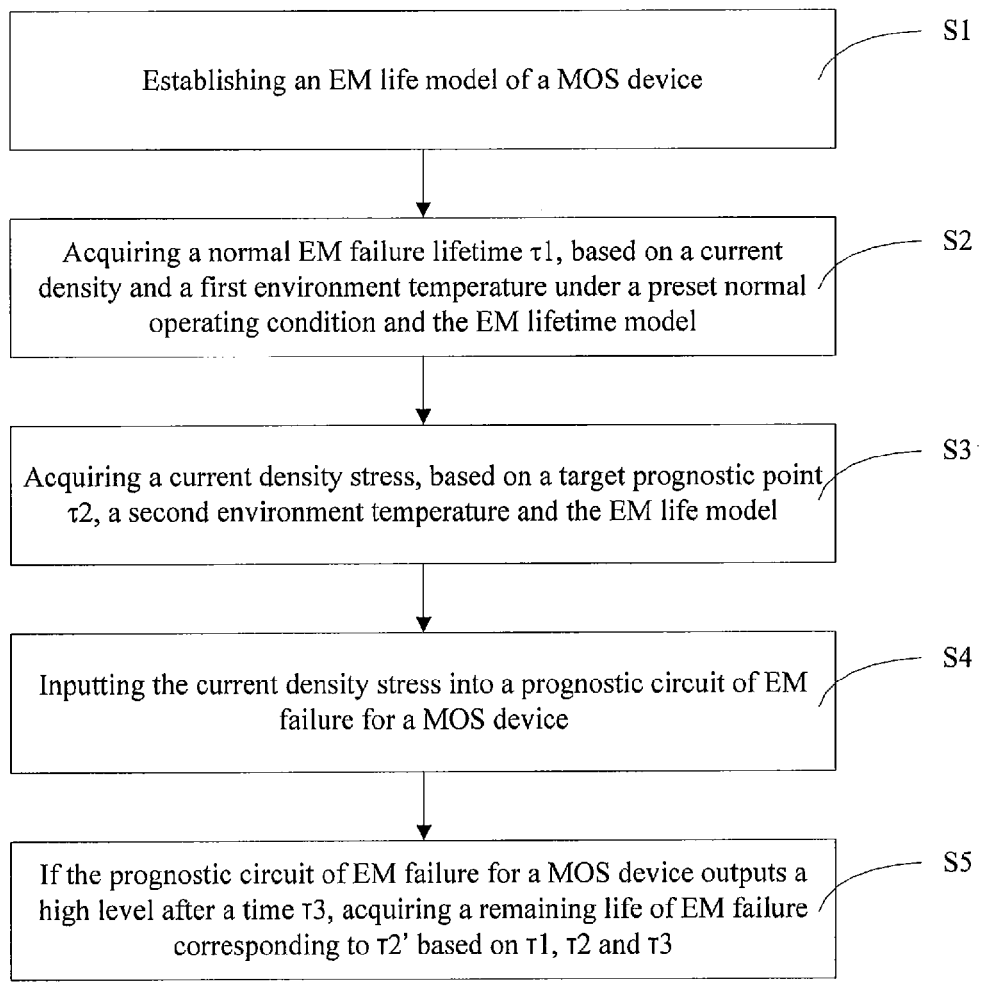
FIG. 1 is a flowchart illustrating a method for predicting remaining life of EM failure according to one embodiment of the present disclosure.

The present disclosure provides a method for predicting remaining life of EM failure, as shown in FIG. 1, includes the following steps:

S1, establishing an EM life model of a MOS device;

S2, acquiring a normal EM failure lifetime τ1, based on a current density and a first environment temperature under a preset normal operating condition and the EM lifetime model;

S3, acquiring a current density stress, based on a target prognostic point τ2, a second environment temperature and the EM life model;

S4, inputting the current density stress into a prognostic circuit of EM failure for a MOS device;

S5, if the prognostic circuit of EM failure for a MOS device outputs a high level after a time τ3, acquiring a remaining life of EM failure corresponding to τ2' based on τ1, τ2 and τ3.

The present disclosure starts with the current active state of the MOS device to predicate the EM failure in the MOS device that may appear in the future combined with the actual working state and working environment of the device, especially before the failure, evaluates the remaining life of the device in order to replace the MOS device near failure before the occurrence of fault, to ensure reliability. The present disclosure needs no periodic test to learn the remaining life before EM failure, which can reduce the cost caused by periodic tests and improve testing efficiency.

Specifically, the present disclosure includes the following steps:

Step 1, establishing an EM life model of a MOS device.

In the embodiment, the life model that accelerates EM failure can be expressed by as Black equation as $$\tau = AJ^{-n}\exp\left(\frac{E_a}{kT}\right), \quad (1)$$

Where τ is a failure time, A is a coefficient that is dependent on metal layer features, J is a current density, n is a current density factor, $E_a$ is activation energy, k is a boltzmann constant, which is $1.38\times10^{-23}$ J/K, and T is an environment temperature.

Step 2, obtaining an EM life model of a MOS device with determined parameters.

The EM life model under operating condition can be obtained according to the formula (1), as $$\tau_{op} = \tau_{MTTF}\left(\frac{J_{use}}{J_{test}}\right)^{-n}\exp\left[\frac{E_a}{k}\left(\frac{1}{T_{use}} - \frac{1}{T_{test}}\right)\right], \quad (2)$$

Where $\tau_{op}$ is a lifetime of EM failure of the MOS device under operating condition, $\tau_{MTTF}$ is a median lifetime under acceleration test condition, $J_{use}$ is a current density under operating condition, $J_{test}$ is a current density under acceleration test condition, $T_{use}$ is an environment temperature under operating condition, and $T_{test}$ is an environment temperature under acceleration test condition.

The undetermined parameters $\tau_{MTTF}$, $J_{test}$, n, $E_a$ and $T_{test}$ can be obtained by experiments or use the prior data directly. In the embodiment, the prior data is directly used, which includes $2.203\times10^3$ s, $1.531\times10^7$ A/cm$^2$, $0.788\times1.602\times10^{-19}$ J and 573 K, so the EM life model of the MOS device with determined parameters is obtained as $$\tau_{op} = 2.203\times10^3\left(\frac{J_{use}}{1.531\times10^7}\right)^{-2}\exp\left[\frac{0.788\times1.602\times10^{-19}}{1.38\times10^{-23}}\left(\frac{1}{T_{use}} - \frac{1}{573}\right)\right]. \quad (3)$$

Step 3, designing a prognostic circuit of EM failure for a MOS device.

Figure 2:
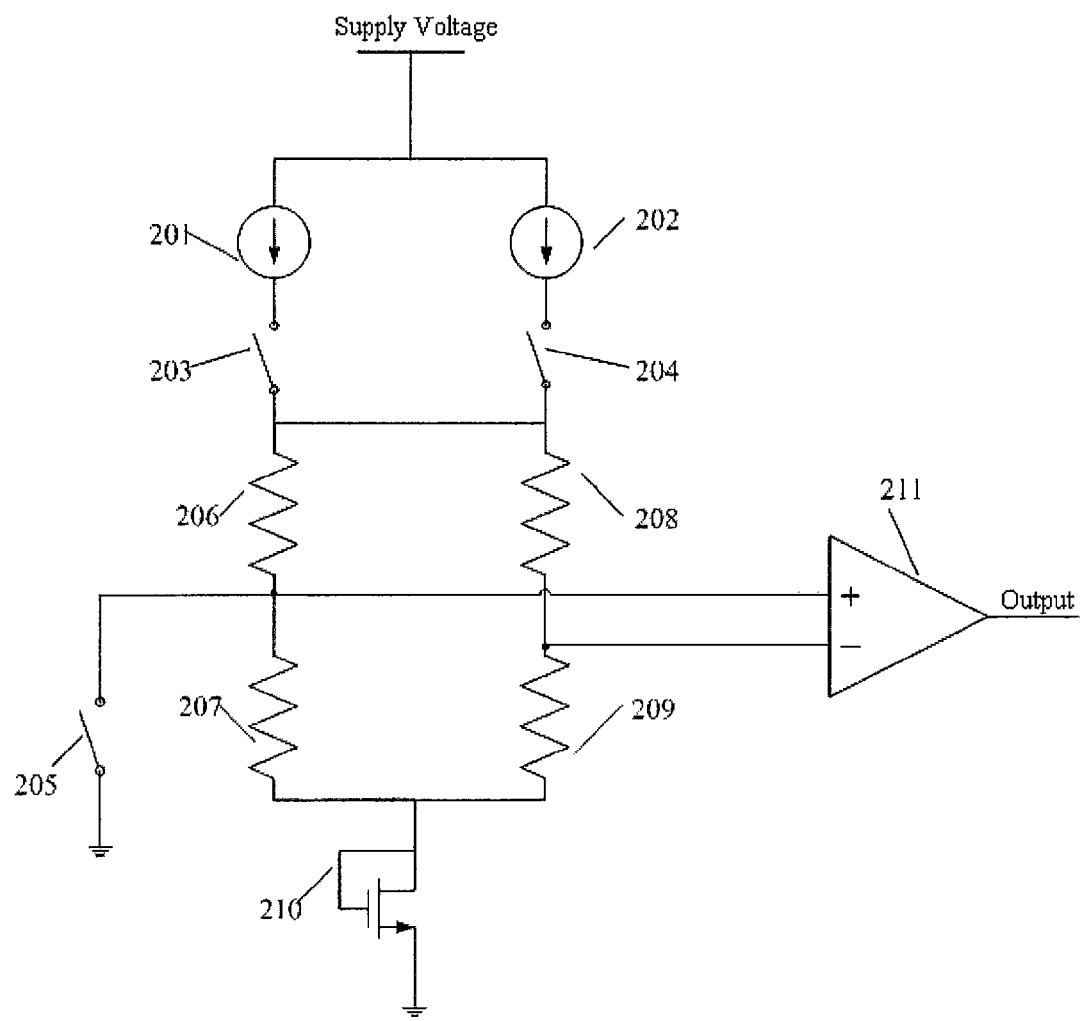
FIG. 2 is a schematic diagram illustrating a prognostic circuit of EM failure for a MOS device according to one embodiment of the present disclosure.

The prognostic circuit of EM failure for a MOS device is a warning circuit that becomes failure due to resistance variation caused by EM, as shown in FIG. 2. It includes a MOS device 210, two metal interconnect resistances 206 and 207 with the same resistance, and two polysilicon resistors 208 and 209 wherein the ratio of the resistance of the polysilicon resistor 208 to that of the polysilicon resistor 209 is 1.2. During a stress current phase, the switches 203 and 205 are closed, the switch 204 is open, and the stress current 201 flows through the metal interconnect resistance 206, to cause EM. During a test current phase, the switch 204 is closed, the switches 203 and 205 are open, and the test current 202 flows through two branches. If there is no EM, the resistance variation of the metal interconnect resistance 206 is less than 20%, and it can be learn from the relationship of voltage division in the two branches that the output of the comparer 211 is at the low level as "0". If there is an EM, the resistance variation of the metal interconnect resistance 206 is larger than 20%, and it can be learn from the relationship of voltage division in the two branches that the output of the comparer 211 is at the high level as "1".

Step 4, acquiring a normal EM failure lifetime τ1, based on a current density and a first environment temperature under a preset normal operating condition.

Put the current density and the first environment temperature under the preset normal operating condition into the above formula (3), and obtain the normal EM failure lifetime τ1.

For example, under the preset normal operating condition, the current density J1 and the first environment temperature which are $8\times10^5$ A/cm$^2$ and 400 K are put into the formula (3), and the normal EM failure lifetime of the MOS device under operating condition can be obtained as $8\times10^8$ s.

Step 5, acquiring a current density stress based on a target prognostic point τ2 and a second environment temperature.

Put the target prognostic point τ2 and the second environment temperature into the above formula (3), and acquire the current density stress.

For example, the target prognostic point τ2 and the second environment temperature which are $6.4\times10^8$ s and 400 K are put into the formula (3) to calculate the current density stress. Then put the current density stress as stress current 201 in FIG. 2.

Step 6, if the prognostic circuit of EM failure for a MOS device outputs a high level after a time τ3, acquiring a remaining life of EM failure corresponding to τ2' based on τ1, τ2 and τ3.

Assume the prognostic circuit of EM failure for a MOS device outputs a high level in the time τ3=$6.4\times10^8$ s that a warning signal is sent, the remaining life of the EM failure corresponding to the target prognostic point τ2' can be acquired by $$\tau2' = \left(\frac{\tau1}{\tau2} - 1\right)\tau3$$

Where τ2' corresponds to the remaining life of the EM failure. Take the data in Step 4 and Step 5 for example, and we can get τ2'=($8\times10^8$/$6.4\times10^8$−1)*$6.4\times10^8$ s=$1.6\times10^8$ s.

In order to predicate different EM remaining lifetime, different current density stress can be designed that a plurality of target prognostic points and environment temperatures can be set, and using the above steps from 1 to 6, the remaining life of the EM failure corresponding to the different target prognostic point can be acquired.

Figure 3:
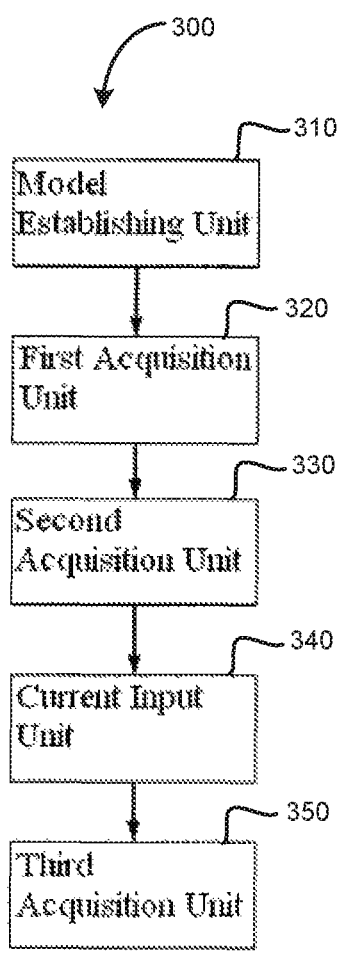
FIG. 3 is a schematic diagram illustrating a device for remaining life prediction for EM failure according to one embodiment of the present disclosure.

The present disclosure also provides a device 300 for remaining life prediction for EM failure, as shown in FIG. 3, includes:

a model establishing unit 310, configured to establish an EM life model of a MOS device;

a first acquisition unit 320, configured to acquire a normal EM failure lifetime τ1, based on a current density and a first environment temperature under a preset normal operating condition and the EM life model;

a second acquisition unit 330, configured to acquire a current density stress, based on a target prognostic point τ2, a second environment temperature and the EM life model;

a current input unit 340, configured to input the current density stress into a prognostic circuit of EM failure for a MOS device; and a third acquisition unit 350, configured to if the prognostic circuit of EM failure for a MOS device outputs a high level after a time τ3, acquire a remaining life of EM corresponding to τ2' based on τ1, τ2 and τ3.

The present disclosure starts with the current active state of the MOS device to predicate the EM failure in the MOS device that may appear in the future combined with the actual working state and working environment of the device, especially before the failure, evaluates the remaining life of the device in order to replace the MOS device near failure before the occurrence of fault, to ensure reliability. The present disclosure needs no periodic test to learn the remaining life before EM failure, which can reduce the cost caused by periodic tests and improve testing efficiency.

Specifically, the first acquisition unit 320 is configured to acquire an EM life model of a MOS device under operating condition based on the EM life model of the MOS device.

Obtain an EM life model of a MOS device with determined parameters, based on the EM life model of the MOS device under operating condition:

$$\tau_{op} = 2.203 \times 10^3 \left(\frac{J_{use}}{1.531 \times 10^7}\right)^{-2} \exp\left[\frac{0.788 \times 1.602 \times 10^{-19}}{1.38 \times 10^{-23}}\left(\frac{1}{T_{use}} - \frac{1}{573}\right)\right],$$

where Top is a lifetime of EM failure of the MOS device under operating condition, Juse is a current density under operating condition, and Tuse is an environment temperature under operating condition.

Acquire a normal EM failure lifetime τ1 based on a current density and a first environment temperature under a preset normal operating condition.

Specifically, the second acquisition unit 330 is configured to acquire a current density stress based on a target prognostic point τ2 and a second environment temperature.

The third acquisition unit 330 is configured to acquire a remaining life of EM failure corresponding to the target prognostic point by $$\tau 2' = \left(\frac{\tau 1}{\tau 2} - 1\right)\tau 3$$

where τ2' is the remaining life of EM failure corresponding to the target prognostic point.

In conclusion, the present disclosure has advantages as follows:

From an economic point of view, the present disclosure is the main technical path for reducing the reliability support cost of MOS devices. The maintenance support cost can be reduced by reducing support resource requirements, such as backup unit, reliability device and manpower for periodic test; the availability rate can be improved by reducing periodic tests, especially, unplanned tests; and the risk caused by a fault of a MOS device during the implementation procedure can be reduced by health perception, to improve the success rate.

From a technical point of view, the present disclosure starts with the current active state of the MOS device to predicate the EM failure in the device that may appear in the future, in order to replace the MOS device near failure before the occurrence of fault, to ensure reliability. In addition to reduce or avoid a major accident in use of the MOS device, the cost caused by periodic tests can be reduced, to improve testing effective. The accident caused by the insufficient of reliability can also be prevented. Especially before the failure, plenty of time between failures can be guaranteed by evaluating the remaining life of the device in order to replace the MOS device near failure before the occurrence of fault.

The embodiments are chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A method for predicting remaining lifetime of EM failure, comprising:

establishing an EM (Electromigration) life model of a MOS (Metal Oxide Semiconductor) device;

acquiring a normal EM failure lifetime τ1, based on a current density and a first environment temperature under a preset normal operating condition and the EM life model;

acquiring a current density stress, based on a target prognostic point τ2, a second environment temperature and the EM life model;

inputting the current density stress into a prognostic circuit for the MOS device, wherein the prognostic circuit comprises a MOS device, two metal interconnect resistances of the same resistance value, and two polysilicon resistors having respective resistance values, wherein the ratio of the resistance value of one of the polysilicon resistors to the resistance value of the other of the polysilicon resistors is a predetermined value; and if the prognostic circuit of EM failure for a MOS device outputs a binary high level after a time τ3, then acquiring a remaining life of EM failure corresponding to a new target prognostic point τ2' based on τ1, τ2 and τ3, comprising:

acquiring a remaining life of EM failure corresponding to the target prognostic point by $$\tau 2' = \left(\frac{\tau 1}{\tau 2} - 1\right)\tau 3,$$

where τ2' is the remaining life of EM failure corresponding to the target prognostic point.

2. The method of claim 1, wherein acquiring a normal EM failure lifetime τ1 based on the current density and a first environment temperature under a preset normal operating condition and the EM life model comprises:

acquiring a first updated EM life model of the MOS device under operating condition based on the EM life model of the MOS device;

obtaining a second updated EM life model of a MOS device with determined parameters based on the EM life model of the MOS device under operating condition:

$$\tau_{op} = 2.203 \times 10^3 \left(\frac{J_{use}}{1.531 \times 10^7}\right)^{-2} \exp\left[\frac{0.788 \times 1.602 \times 10^{-19}}{1.38 \times 10^{-23}}\left(\frac{1}{T_{use}} - \frac{1}{573}\right)\right],$$

wherein $\tau_{op}$ is a lifetime of EM failure of the MOS device under operating condition, $J_{use}$ is the current density under operating condition, and $T_{use}$ is an environment temperature under operating condition; and acquiring a normal EM failure lifetime τ1, based on the current density and a first environment temperature under a preset normal operating condition and the second updated EM life model of the MOS device with determined parameters.

3. The method for predicting remaining life of EM failure of claim 2, wherein acquiring a current density stress based on a target prognostic point τ2, a second environment temperature and the EM life model comprises: acquiring a current density stress based on a target prognostic point τ2, a second environment temperature and the second updated EM life model of the MOS device with determined parameters.

\* \* \* \* \*